(12) United States Patent
Yamamoto et al.

(10) Patent No.: US 9,595,912 B2
(45) Date of Patent: Mar. 14, 2017

(54) LIGHT CONCENTRATOR AND A SOLAR CELL

(71) Applicant: KABUSHIKI KAISHA TOSHIBA, Minato-ku, Tokyo (JP)

(72) Inventors: Kazushige Yamamoto, Kanagawa (JP); Hiroshi Ohno, Kanagawa (JP); Soichiro Shibasaki, Tokyo (JP); Hiroki Hiraga, Kanagawa (JP); Naoyuki Nakagawa, Tokyo (JP); Mutsuki Yamazaki, Kanagawa (JP); Shinya Sakurada, Tokyo (JP); Michihiko Inaba, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/132,380

(22) Filed: Dec. 18, 2013

(65) Prior Publication Data
US 2014/0166078 A1    Jun. 19, 2014

(30) Foreign Application Priority Data
Dec. 19, 2012  (JP) ................................ 2012-276688

(51) Int. Cl.
*H01L 31/052*    (2014.01)
*H01L 31/042*    (2014.01)
(Continued)

(52) U.S. Cl.
CPC ............ *H02S 40/22* (2014.12); *H01L 31/048* (2013.01); *H01L 31/0547* (2014.12);
(Continued)

(58) Field of Classification Search
None
See application file for complete search history.

(56) References Cited

U.S. PATENT DOCUMENTS 4,892,385 A * 1/1990 Webster, Jr. ......... B42D 25/328
                                                                    283/91
5,881,186 A * 3/1999 Starodubov ..................... 385/37
(Continued)

FOREIGN PATENT DOCUMENTS

JP    10-123341    5/1998
JP    2009-238902    10/2009
(Continued)

OTHER PUBLICATIONS

Rosenblatt, et al., "Resonant grating waveguide structures," Quantum Electronics, IEEE Journal of, vol. 33, pp. 2038-2059, Nov. 1997.*
(Continued)

*Primary Examiner* — Allison Bourke
*Assistant Examiner* — William E McClain
(74) *Attorney, Agent, or Firm* — Amin, Turocy & Watson LLP (57) ABSTRACT

A light concentrator of an embodiment includes: a first high refractive index layer, a first low refractive index layer, and a second high refractive index layer stacked in sequence, wherein a surface on the first low refractive index layer side of the first high refractive index layer has a periodic concavoconvex region.

20 Claims, 9 Drawing Sheets (51) Int. Cl.
    *G02B 7/183*     (2006.01)
    *H02S 40/22*     (2014.01)
    *H02S 40/20*     (2014.01)
    *H01L 31/048*     (2014.01)
    *H01L 31/054*     (2014.01)
    *F21V 8/00*     (2006.01)

(52) U.S. Cl.
    CPC .............. *H02S 40/00* (2013.01); *H02S 40/20* (2014.12); *G02B 6/005* (2013.01); *Y02E 10/52* (2013.01)

(56) References Cited

U.S. PATENT DOCUMENTS

| | | | |
|---|---|---|---|
| 6,934,425 B2 * | 8/2005 | Yariv | 385/10 |
| 8,328,403 B1 * | 12/2012 | Morgan | G02B 6/26 362/606 |
| 2009/0126792 A1 | 5/2009 | Gruhlke et al. | |
| 2009/0245314 A1 | 10/2009 | Yamamoto et al. | |
| 2010/0037954 A1 * | 2/2010 | Thony | H01L 31/0547 136/259 |
| 2010/0126577 A1 * | 5/2010 | Wu et al. | 136/256 |
| 2010/0229943 A1 * | 9/2010 | Ji | B82Y 20/00 136/257 |
| 2010/0288352 A1 * | 11/2010 | Ji et al. | 136/256 |
| 2011/0083739 A1 * | 4/2011 | Peng et al. | 136/259 |
| 2011/0102777 A1 | 5/2011 | Zinoviev et al. | |
| 2011/0226332 A1 | 9/2011 | Ford et al. | |
| 2011/0296726 A1 | 12/2011 | Rinko | |
| 2011/0297220 A1 | 12/2011 | Rinko | |

FOREIGN PATENT DOCUMENTS

| | | | |
|---|---|---|---|
| JP | 2010-206165 | 9/2010 | |
| JP | 2011-503902 | 1/2011 | |
| JP | 2011-519071 | 6/2011 | |
| WO | 2010/033859 A2 | 3/2010 | |
| WO | WO 2010033859 A2 * | 3/2010 | ........... H01L 31/052 |
| WO | 2011/124764 A1 | 10/2011 | |

OTHER PUBLICATIONS

Yu, et al., "Fundamental limit of nanophotonic light trapping in solar cells," PNAS, vol. 107, pp. 17491-17496 (Oct. 12, 2010).*

Xiao, et al., "Broadband enhancement of light harvesting in a Luminescent Solar Concentrator," IEEE Journal of Quantum Electronics, vol. 47, pp. 1171-1176 (Sep. 2011).*

Almeida, et al. "Guiding and confining light in void nanostructure", Jun. 1, 2004, vol. 29, No. 11, Optics Letters, pp. 1209-1211.

Japanese Office Action for Japanese Patent Application No. 2012-276688 mailed on May 10, 2016.

* cited by examiner

LIGHT CONCENTRATOR AND A SOLAR CELL

CROSS-REFERENCE TO RELATED APPLICATION

This application is based upon and claims the benefit of priority from Japanese Patent Application No. 2012-276688 Dec. 19, 2012; the entire contents of which are incorporated herein by reference.

FIELD

Embodiments described herein relate generally to a light concentrator and a solar cell.

BACKGROUND

Although examples of renewable energy include solar power generation, its penetration rate is still low. It is effective for a further widespread use of solar power generation to achieve high efficiency and low cost. As solar cells having been currently put to practical use, there have been known single-crystal Si, polycrystalline Si, amorphous Si, CIGS, and CdTe. However, since any of the solar cells are of a unijunction type, a theoretical upper limit of the efficiency is up to 30%.

As a candidate of a future solar cell capable of simultaneously realizing the high efficiency and the low cost, a light concentrating-type solar cell has been proposed. The light concentrating-type solar cell has an advantageous in terms of high efficiency and in that a panel area can be reduced for light concentrate. However, as disadvantages of the light concentrating-type solar cell, since a lens and a reflecting mirror are used for light concentrate, a structure of a light concentrator is complicate, heavy, and large, and in addition, a sunlight tracking device is required; therefore, contrary to expectations, there is a problem that the power generation cost is extremely high at present.

DETAILED DESCRIPTION

A light concentrator of an embodiment includes: a first high refractive index layer, a first low refractive index layer, and a second high refractive index layer stacked in sequence, wherein a surface on the first low refractive index layer side of the first high refractive index layer has a periodic concavoconvex region. A stacked type light concentrator includes: plurality of the above concentrator and a second low refractive index layer which is between the second high refractive index layer of the one concentrator and the first low refractive index layer of the other concentrator.

A solar cell of an embodiment includes: the above concentrator or the above stacked type concentrator and a photoelectric conversion element on an optical path of light concentrated by the above concentrator or the above stacked type concentrator.

Hereinafter, embodiments are exemplified with reference to the drawings. The sizes of components in the drawings include one that does not accurately represent a relationship between the sizes of actual members. A high refractive index layer and a low refractive index layer other than a concavoconvex region each have a high light transmitting property and are smooth and flat layers, unless otherwise specified. The refractive index is a value with respect to light having a wavelength of 400 nm.

First Embodiment

Figure 1:
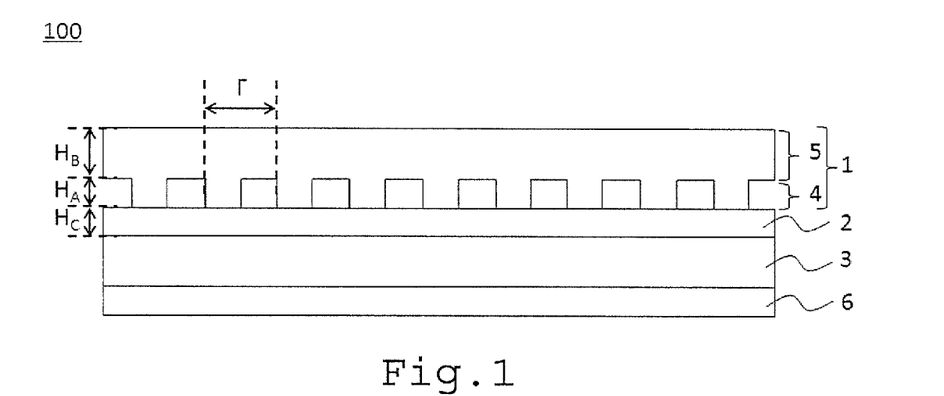
FIG. 1 is a cross-sectional conceptual diagram of a light concentrator of an embodiment.

FIG. 1 is a cross-sectional conceptual diagram of a light concentrator 100 according to a first embodiment. In the light concentrator 100, a first high refractive index layer 1, a first low refractive index layer 2, and a second high refractive index layer 3 are stacked in sequence, and a surface on the first low refractive index layer side of the first high refractive index layer has a periodic concavoconvex region 4. The light concentrator 100 has an air space or a second low refractive index layer 6 on a surface on the opposite side of a surface stacked with the second high refractive index layer 3 and the first low refractive index layer 2. The refractive indexes of the first high refractive index layer 1, the first low refractive index layer 2, the second high refractive index layer 3, and the second low refractive index layer 6 (or the air space) are represented respectively by $n_{H1}$, $n_{S1}$, $n_{H2}$ and $n_{S2}$. A concavoconvex height is represented by $H_A$, a thickness of a plate-shaped region is represented by $H_B$, and a thickness of the first low refractive index layer is represented by $H_C$.

The first high refractive index layer 1 is a layer into which light from the outside enters. The first high refractive index layer 1 is constituted of a region on first and second main surface sides, has a plate-shaped region 5 on the first main surface side, and has the periodic concavoconvex region 4 on the second main surface side. The first low refractive index layer 2 is in contact with the second main surface side. $n_{H1}$ as the refractive index of the first high refractive index layer 1 is higher than $n_{S1}$ as the refractive index of the first low refractive index layer 2 ($n_{H1} > n_{S1}$). $n_{H1}$ is preferably not less than 1.5 and not less than 1.5 times $n_{S1}$. The first high refractive index layer 1 may be formed of glass, resin, or the like, for example.

In the periodic concavoconvex region 4, light incident from the first main surface of the first high refractive index layer 1 is diffracted by the periodic concavoconvex region 4. Examples of the periodic concavoconvexes include a diffraction grating shape. Although various patterns can be used as the diffraction grating shape, a two-dimensional pattern in which dots are arranged is particularly preferable. The concavoconvex shape of the periodic concavoconvex region 4 may be any shape as long as it is used as the diffraction grating, and examples of the shape include a triangular lattice, a square grating, a cubic lattice, and a one-dimensional pattern. The concave portion is a region of vacuum, air, or a low refractive index material. When the concave portion is made of the low refractive index material, the refractive index may be lower than the first high refractive index.

Although the wavelength band in which the light concentrator 100 is diffracted and concentrates light is changed by a pitch as the period of the periodic concavoconvex region 4, the height of the concavoconvexes, the thickness of the first low refractive index layer 2, and so on, the pitch of the period of the periodic concavoconvex region 4 can be substantially designed from the wavelength band in which diffraction and light concentrate are performed. As a specific example, when the wavelength in which diffraction and light concentrate are performed is $\lambda$ (design wavelength), the pitch $\Gamma$ of the periodic concavoconvex region 4 can be within a range of $0.7\lambda \leq \Gamma \leq 1.5\lambda$.

When the concavoconvex height $H_A$ of the periodic concavoconvex region 4 is too large, it is not preferable in terms of manufacturing cost, and it is also not preferable in terms of diffraction efficiency. The concavoconvex height $H_A$ of the periodic concavoconvex region 4 may be 300 nm when the pitch is 460 nm and may be 570 nm when the pitch is 880 nm.

The concavoconvex height is preferably approximately 1.3 times the half pitch, for example. This is a numerical value experimentally obtained by optical simulation such as RCWA (rigorous coupled wave analysis).

The first low refractive index layer 2 is provided between the first high refractive index layer 1 and the second high refractive index layer 3. $n_{S1}$ is lower than $n_{H1}$ and $n_{H2}$ as the refractive index of the second high refractive index layer 3 ($n_{S1}<n_{H1}$, $n_{S1}<n_{H2}$). $n_{S1}$ is not more than 1.3, for example. The first low refractive index layer 2 may be formed of glass, resin, or the like, for example. The thickness $H_C$ of the first low refractive index layer 2 preferably satisfies 10 nm$\leq H_C \leq$200 nm, for example.

The second high refractive index layer 3 is provided on a surface of the first low refractive index layer 2 on the opposite side of the surface on which the first high refractive index layer 1 is provided. $n_{H2}$ is higher than $n_{S1}$. On a surface of the second high refractive index layer 3 on the opposite side of the surface on which the first low refractive index layer 2 is provided, there is air as an open surface, or a second low refractive index layer 6 may be provided. $n_{S2}$ as the refractive index of the second low refractive index layer 6 is lower than $n_{H2}$. The second high refractive index layer 3 has a refractive index higher than that of air and the second low refractive index layer 6. The refractive index of the second high refractive index layer 3 is not less than 1.5, for example. When a difference of the refractive index is large between the second high refractive index layer 3 and the first low refractive index layer 2, it is preferable in terms of the light concentrating rate. Accordingly, the refractive index of the second high refractive index layer 3 is preferably not less than 1.8, for example. The second high refractive index layer 3 propagates light, using the action of total reflection.

The second low refractive index layer 6 can be omitted as described above. When the second low refractive index layer 6 is omitted, an air space becomes a layer having functions the same as those of the second low refractive index layer 6.

Figure 2:
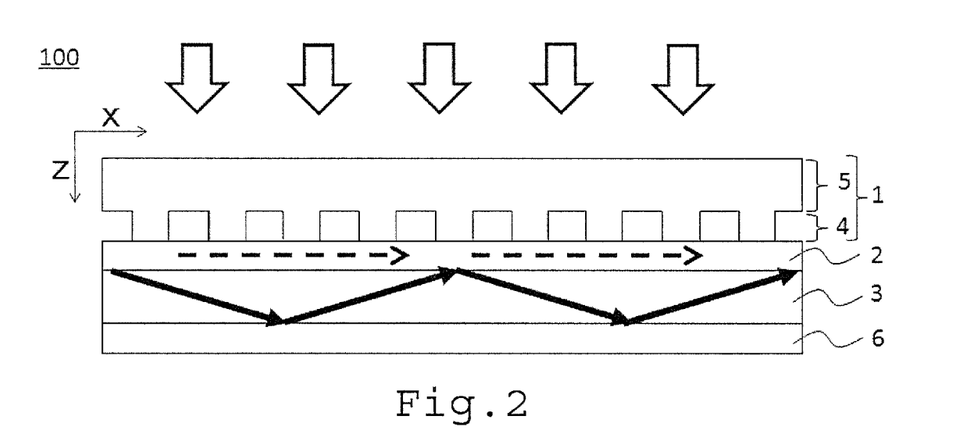
FIG. 2 is a cross-sectional conceptual diagram showing a waveguide of a light concentrator of an embodiment.

In the light concentrator 100 of the embodiment, as shown in the conceptual diagram of FIG. 2, light incident on the first high refractive index layer 1 has two light propagation modes. The x axis and z axis are common in FIGS. 2 and 3. The first light propagation mode is shown by the solid line and is a total reflection mode in which light propagates in the second high refractive index layer 3. The second light propagation mode is shown by the dashed line and is a slot waveguide mode in which light propagates in the first low refractive index layer 2.

Figure 3:
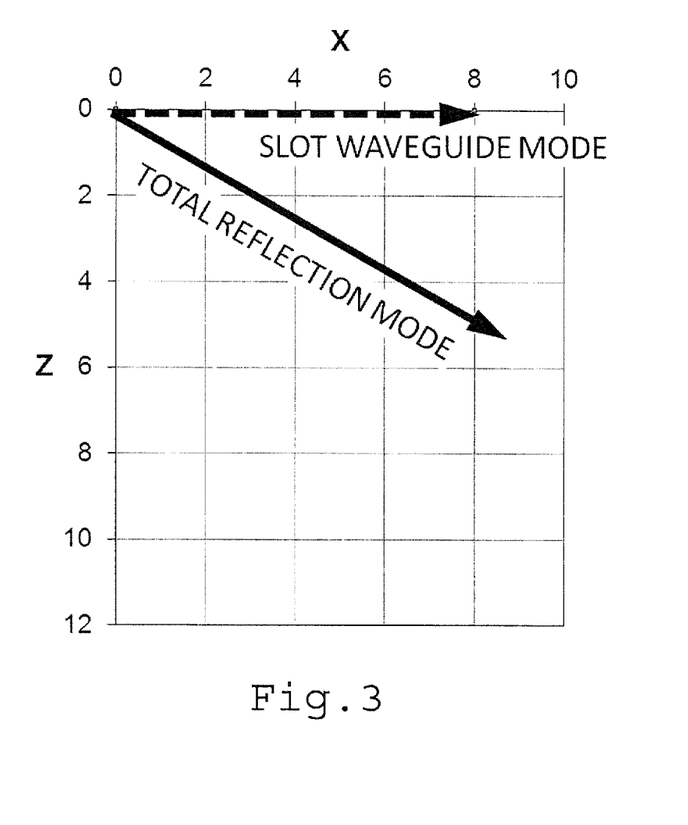
FIG. 3 is a vector diagram showing a propagation direction (pointing vector) of light passing through a waveguide of an embodiment.

The vector diagram of FIG. 3 shows a result obtained by calculating the light propagation mode inside the light concentrator shown by the dashed line and the solid line of FIG. 2, using a panel light concentrator of FIG. 2 as a model. Based on the calculation, it is found that the two propagation modes apparently exist, one of the propagation modes is the slot waveguide mode in which light propagates in a low refractive index layer narrower than the wavelength of the light, and the other is the total reflection mode in which light propagates in an inner high refractive index layer held between low refractive index layers. The calculation conditions are $n_{H1}$=1.86, $n_{S1}$=1.1, $n_{H2}$=1.86, $H_A$=300 nm, $H_C$=30 nm, and $\Gamma$=460 nm, and the light propagation mode is calculated by RCWA.

The light diffracted in the periodic concavoconvex region 4 shown in FIG. 2 passes through the first low refractive index layer 2 and is totally reflected at a surface on the second low refractive index layer 6 side of the second high refractive index layer 3. The totally reflected light is demultiplexed into light in the total reflection mode and light in the slot waveguide mode on the surface on the first low refractive index layer 2 side of the second high refractive index layer 3. After that, it is considered that the light propagates in the light concentrator while being repeatedly multiplexed and demultiplexed between the modes and finally reaches an end of the light concentrator 100.

The calculation shows that the light that is once confined in the panel light concentrator propagates with little loss. The calculation further shows that the slot waveguide mode is not generated in the second low refractive index layer.

Since the diffracted light propagates in the total reflection mode, it is preferable that the following conditions are satisfied, for example. When a diffraction angle is $\theta_m$ (=$\sin^{-1}$ $(m \cdot \lambda / \Gamma)$ (m=±1, +2 . . . )), light is totally reflected by an interface between the first low refractive index layer 2 and the second high refractive index layer 3, and therefore, it is preferable that $\theta_m \geq \sin^{-1}(n_{H2}/n_{S1})$ is satisfied. Since light is totally reflected by an interface between the second low refractive index layer 6 and the second high refractive index layer 3, it is preferable that $\theta_m \geq \sin^{-1}(n_{H2}/n_{S2})$ is satisfied.

When the above conditions are satisfied, incident light having a wavelength within a range of $0.7\lambda<\Gamma<1.5\lambda$ of all incident lights can be substantially 100% diffracted and concentrated.

The slot waveguide means a waveguide constituted of a low refractive index region (or vacuum or a gas atmosphere containing air) provided in a high refractive index region or between the high refractive index regions and is a waveguide having a nanometer scale far narrower than a wavelength size of light (Document 1; V. R. Almeida, Q. Xu, C. A. Barrios, and M. Lipson, Opt. Lett, 29, 1209(2004). This constitution corresponds to a constitution in which the first high refractive index layer 1, the first low refractive index layer 2, and the second high refractive index layer 3 are stacked. The slot waveguide phenomenon is a phenomenon in which light in a TE mode (in the structure of FIG. 1, light whose photoelectric field is vertical to a low refractive index region/high refractive index region interface) selectively propagates while being strongly confined in the low refractive index slot waveguide.

Figure 4:
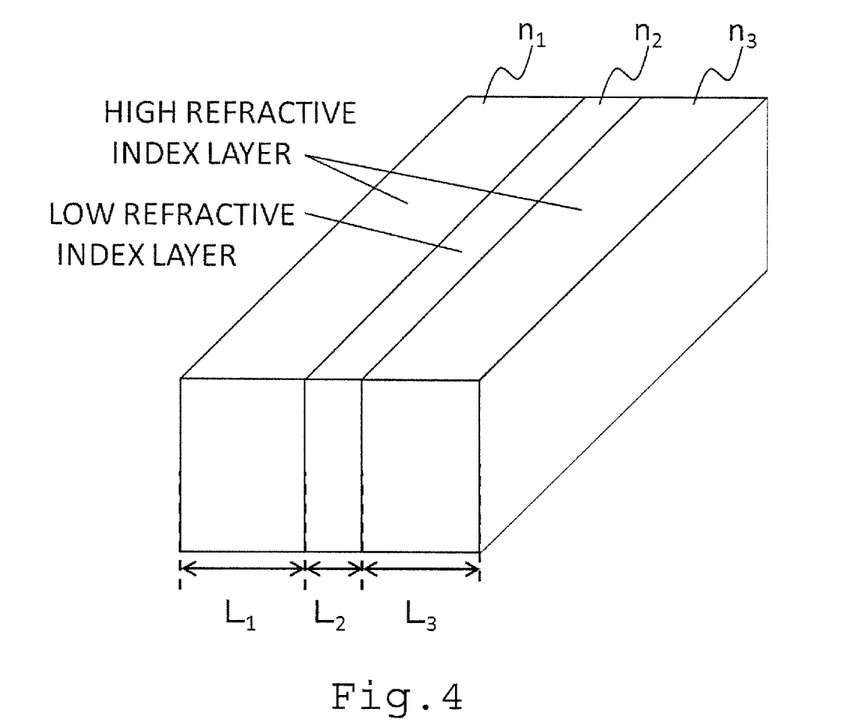
FIG. 4 is a waveguide model for explaining a slot waveguide.

In the essence of this phenomenon, in order to satisfy Maxwell's equation, not the photoelectric field but an electric flux is preserved in a normal direction of the low refractive index region/high refractive index region interface of FIG. 4. When $n_S$ and $n_H$ are respectively the refractive index of the low refractive index region and the high refractive index region, $\epsilon_S(\approx n_S^2)$ and $\epsilon_H(\approx n_H^2)$ are the respective permittivities of the low refractive index region and the high refractive index region, and when $E_S$ and $E_H$ are a low refractive index side photoelectric field and a high refractive index side photoelectric field in the interface, the electric flux $D=\epsilon_S \cdot E_S = \epsilon_H \cdot E_H$. Accordingly, $E_S=E_H(\epsilon_H/\epsilon_S) \approx E_H(n_H/n_S)^2$, and the photoelectric field on the low refractive index side of the interface increases to $(n_H/n_S)^2$ times with respect to the high refractive index side.

The increase of the photoelectric field is a phenomenon occurring only at a refractive index interface, and the photoelectric field on the low refractive index side is rapidly attenuated as it is away from the interface. Namely, the photoelectric field on the low refractive index side is a kind of an evanescent field of the refractive index interface. However, since a low refractive index region in the slot waveguide is very narrow, a photoelectric field enhancement effect of two refractive index interfaces are added to each other, a propagation mode in which light is strongly confined in the low refractive index region is formed, and in this point it is different from rapidly attenuating evanescent light. From the above, the thickness of the first low refractive index layer 2 is preferably not more than 200 nm. The light having a wavelength that has not been concentrated transmits through the light concentrator 100.

The light concentrator 100 of the embodiment is analyzed, and a cross section in which the concavoconvexes of the first high refractive index layer 1 can be confirmed is observed by SEM, whereby the structure can be known. The presence and absence of the two light propagation modes can be confirmed by a radiation pattern (also referred to as light distribution) from an end of the light concentrator. The presence of the two light propagation modes can be confirmed by the radiation pattern from the end of the light concentrator, zero-order light is in the slot waveguide mode, and first or higher order light is in the total reflection mode.

[Manufacturing Method]

Figure 5:
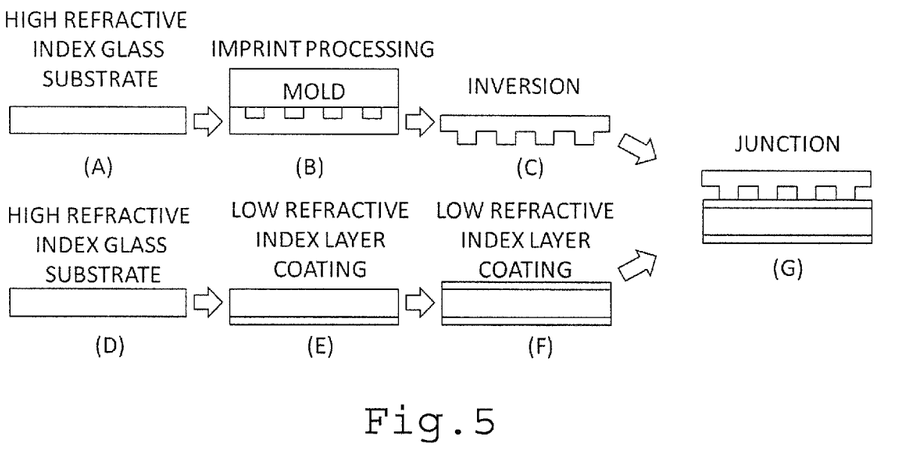
FIG. 5 is a flow diagram of a method of manufacturing a light concentrator of an embodiment.

Next, a method of manufacturing the light concentrator 100 of the embodiment will be described. FIG. 5 is flow diagram of a production flow of a pair of panel light concentrators according to an imprinting technique. In the light concentrator 100 of the embodiment, there is used a manufacturing process in which the first high refractive index layer 1, which is an upper layer portion diffracting light, and a lower layer portion (the first low refractive index layer 2 to the second low refractive index layer 6) totally reflecting diffracted light and leading the light to the slot waveguide are separately formed and thereafter integrated with each other.

In the formation of a diffraction grating of the upper layer portion, the imprinting technique is used. More specifically, a high refractive index glass substrate is heated to near the melting point to be softened (A), a mold of the diffraction grating is pressed against the substrate to directly form a pattern thereon. Alternatively, a resist layer is provided on a high refractive index glass, a pattern is temporarily transferred to the layer, and the pattern is formed by etching the glass, using a resist pattern (including cases where a pattern is transferred to a hard mask) as a mask (FIG. 5B shows only direct pattern formation). A member formed with the pattern is separated from the mold and inverted (C) Meanwhile, in the lower layer portion, low refractive index layers are formed on a high refractive index glass substrate (D) by coating the low refractive index layers on front and back surfaces of the high refractive index glass or by other method (E), (F). The upper layer and the lower layer thus formed are joined (G), whereby a pair of panel light concentrators can be produced.

Second Embodiment

Figure 6:
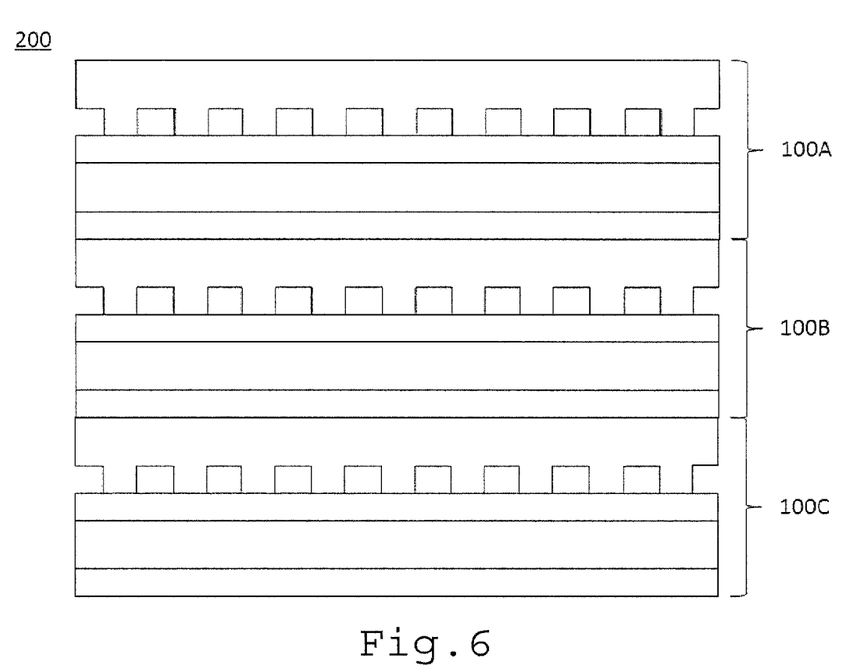
FIG. 6 is a cross-sectional conceptual diagram of a stacked type light concentrator of an embodiment.

FIG. 6 shows a cross-sectional conceptual diagram of a stacked type light concentrator 200 of a second embodiment. The stacked type light concentrator 200 is in the form in which light concentrators 100A, 100B and 100C similar to the light concentrator of the first embodiment are stacked. With respect to the configuration of the stacked light concentrators 100A to 100C which is common to that of the first embodiment, description thereof will be omitted. The stacked light concentrators 100A to 100C are configured to concentrate light in different wavelength bands respectively. In order to change the wavelength band in which light is concentrated, a pitch of periodic concavoconvex regions 4A to 4C in the first high refractive index layers 1A to 1C may be changed, for example. When the pitches of the periodic concavoconvex regions 4A to 4C are changed, light in a wider wavelength band can be concentrated in comparison with the light concentrator 100 of the first embodiment.

Although the stacked type light concentrator 200 of the second embodiment has a configuration that three light concentrators are stacked, two or more light concentrators may be stacked. In terms of the fact that in general, light in a shorter wavelength band is more easily affected by absorption and scattering according to a material, it is preferable that the light concentrator 100A on the incident light side concentrates light in the shortest wavelength band, and light in longer wavelength bands are concentrated in order of the light concentrators 100B and 100C.

Third Embodiment

Figure 7:
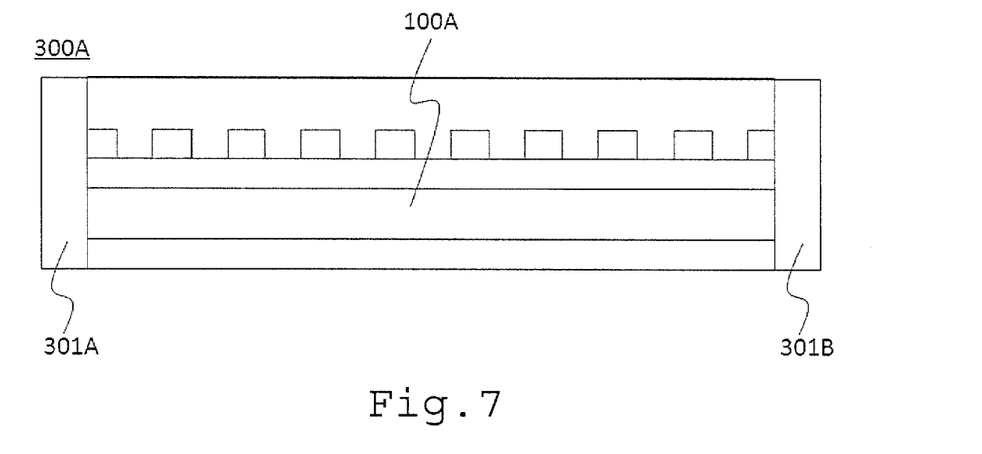
FIG. 7 is a cross-sectional conceptual diagram of a solar cell of an embodiment.

This embodiment shows a solar cell 300 in the form in which a photoelectric conversion element is provided on an optical path of concentrated light by a concentrator, and the concentrated light is guided to the photoelectric conversion element. FIG. 7 shows a cross-sectional conceptual diagram of the solar cell 300 of the third embodiment. The solar cell 300 is in the form in which a photoelectric conversion element 301 is provided at the end of the light concentrator 100 of the first embodiment. The photoelectric conversion element 301 converting light to electric energy may be used. In the conceptual diagram of FIG. 7, although the photoelectric conversion elements 301 are provided at the both ends of the waveguide of the light concentrator 100, the photoelectric conversion element 301 may be provided at one end, and a reflecting plate may be provided at the other end. Among the ends of the light concentrator 100, the photoelectric conversion elements 301 may be provided at least at ends of a first low refractive index layer 2 and a second high refractive index layer 3.

As the photoelectric conversion element 301, silicon-based, compound based, organic-based, quantum dot-based, or multi-junction type photoelectric conversion element is preferably used. The wavelength band in which light is concentrated is determined by design of, for example, a periodic concavoconvex region 4 of the light concentrator 100. As the photoelectric conversion element 301, it is preferable to use one having a light absorption layer having a suitable band gap so that the light in the wavelength band in which the light concentrator 100 concentrates light is efficiently converted into electricity.

The thickness of the light concentrator 100 is small, and for example, the thickness can be set to several millimeters; therefore, a light receiving area of the photoelectric conversion element 301 can be significantly reduced without reducing the conversion efficiently with respect to the light receiving area of the light concentrator 100.

When the photoelectric conversion element 301 reaches high temperature, the amount of power generated by the photoelectric conversion element 301 may be reduced. In the solar cell 300 of the embodiment, since only light in the light concentrating wavelength band arrives at the photoelectric conversion element 301, light in a wavelength band longer than a near-infrared wavelength region having a wavelength of 1300 nm in which the photoelectric conversion element is heated can be prevented from entering the photoelectric conversion element 301. The constitution in which light in a wavelength band heating the photoelectric conversion element 301 does not arrive at the photoelectric conversion element 301 can prevent reduction in the power generation amount due to temperature rise.

Fourth Embodiment

Figure 8:
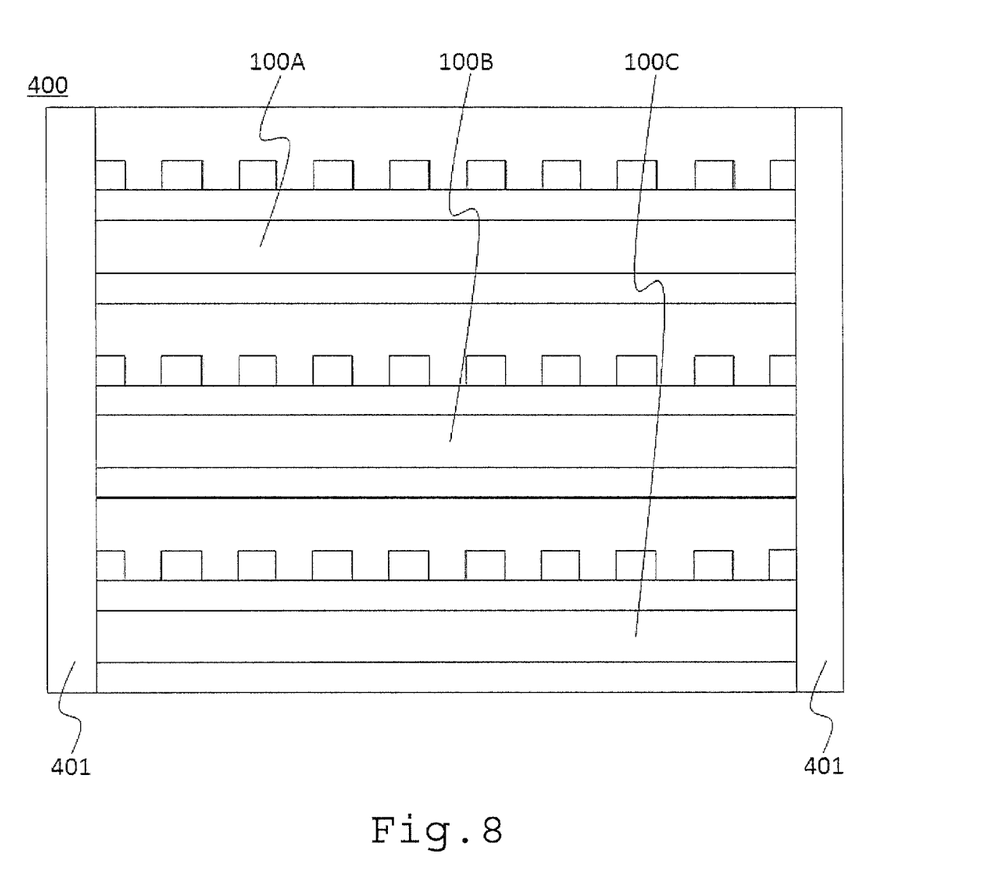
FIG. 8 is a cross-sectional conceptual diagram of a stacked type solar cell of an embodiment.

FIG. 8 shows a cross-sectional conceptual diagram of a solar cell 400 of the fourth embodiment. In the solar cell 400, a photoelectric conversion element 401 is provided at an end of the stacked type light concentrator 200 of the second embodiment. The descriptions of configurations common to those of the above embodiment are omitted.

Since the stacked type light concentrator 200 is used, a light concentratable wavelength band is widened, whereby a propagatable wavelength band spreads to the photoelectric conversion element 401. Accordingly, the solar cell 400 can enhance power generation efficiency.

Fifth Embodiment

Figure 9:
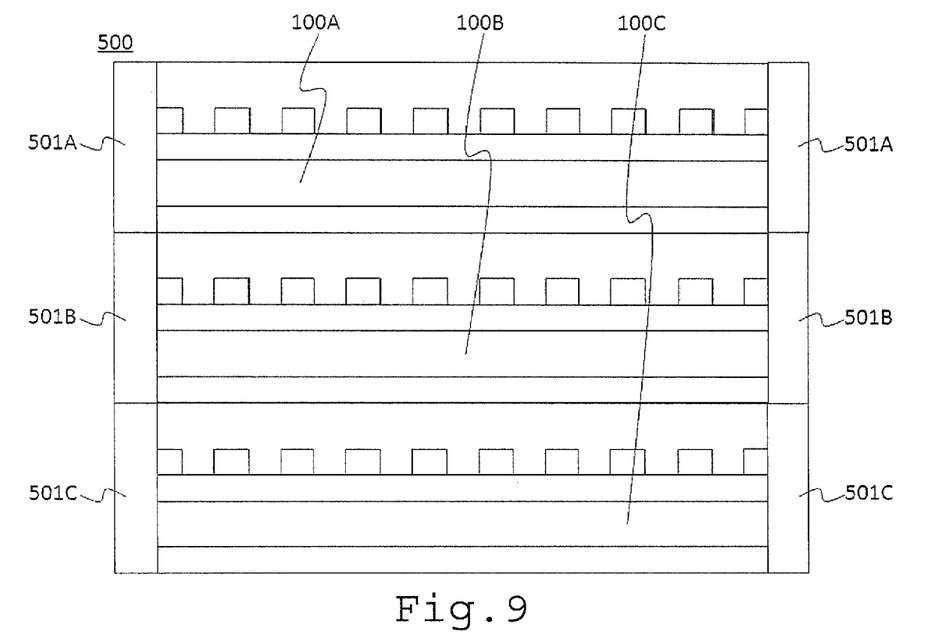
FIG. 9 is a cross-sectional conceptual diagram of a stacked type solar cell of an embodiment.

FIG. 9 shows a cross-sectional conceptual diagram of a solar cell 500 of the fifth embodiment. In a solar cell 500, a photoelectric conversion elements 501A to 501C having different bad gaps are provided at the end of the stacked type light concentrator 200 of the second embodiment. The band gap of the photoelectric conversion element 501A can be made adapted to a light concentrating wavelength band of a light concentrator 100A. In the adaptation, when the pitches of the periodic concavoconcex region 4 of the photoelectric conversion elements 501A to 501C are respectively $\Gamma_A$, $\Gamma_B$ and $\Gamma_C$ and the respective absorption edge wavelengths of the photoelectric conversion elements are $\lambda_A$, $\lambda_B$ and $\lambda_C$, a size relation between the pitches and a size relation between the absorption edge wavelengths correspond to each other. For example, when $\Gamma_A < \Gamma_B < \Gamma_C$, $\lambda_A \leq \lambda_B \leq \lambda_C$ is established.

The light concentrators 100A to 100C and the photoelectric conversion elements 501A to 501C are adapted in the light concentrating wavelength band and the band gap, whereby the solar cell 500 can further enhance the power generation efficiency.

Sixth Embodiment

Figure 10:
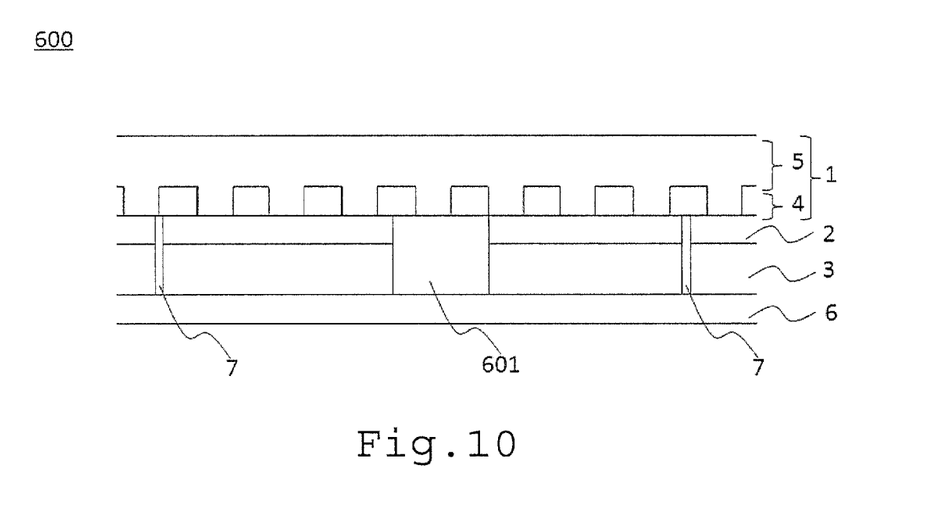
FIG. 10 is a cross-sectional conceptual diagram of a stacked type solar cell of an embodiment.

FIG. 10 shows a cross-sectional conceptual diagram of a solar cell 600 of the sixth embodiment. The solar cell 600 is in the form in which a photoelectric conversion element 601 is provided not at the end of the light concentrator but in an optical waveguide. In this constitution, light entering from the both sides of the photoelectric conversion element 601 is photoelectrically converted. Even if the photoelectric conversion element 601 is provided at a portion other than the light concentrator 100, power generation can be performed at high efficiencies. In order to concentrate light at the intended position, a reflecting plate 7 can be provided on the waveguide of the light concentrator, as shown in FIG. 10.

Seventh Embodiment

Figure 11:
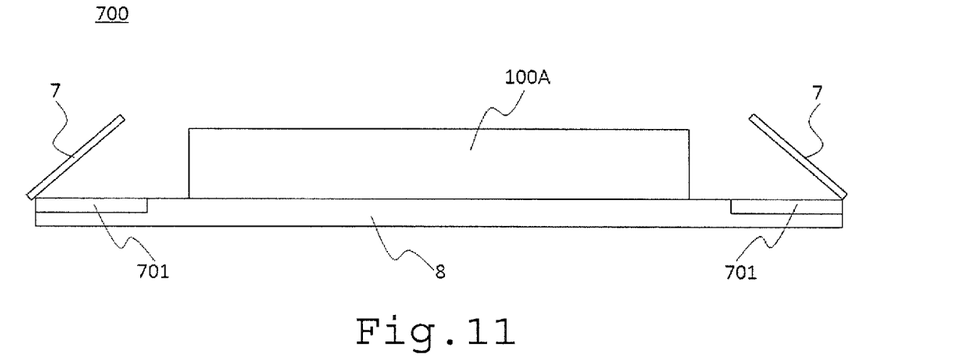
FIG. 11 is a cross-sectional conceptual diagram of a stacked type solar cell of an embodiment.

FIG. 11 shows a cross-sectional conceptual diagram of a solar cell 700 of the seventh embodiment. The solar cell 700 is provided with a light concentrator 100A, a reflecting plate 7 reflecting light concentrated on an optical path of the light concentrator 100A, a photoelectric conversion element 701 into which the reflected light enters, and a support material 8 on which the light concentrator 100A is arranged. The solar cell 700 is in the form in which the concentrated light is reflected by the reflecting plate 7 and thereby guided to the photoelectric conversion element 701. The reflecting plate 7 and the photoelectric conversion element 701 can be arranged so that the angles and positions are designed according to the optical path. In order to facilitate light to enter into the photoelectric conversion element 701, an end of the light concentrator 100A may be an inclined surface. In this embodiment, in addition to the above advantages, when a margin is given to the arrangement of the reflecting plate 7 and the photoelectric conversion element 701, if the position of the light concentrator 100 is within a desired range relative to design, a designed effect can be obtained, and there is such an advantage that production can be performed at high yield in mass production. This embodiment is useful, for example, when it is difficult to form the photoelectric conversion element 701 at the end of the light concentrator 100, when positioning accuracy of the photoelectric conversion element 701 is less likely to be obtained, and when a large cost is required.

Eighth Embodiment

Figure 12:
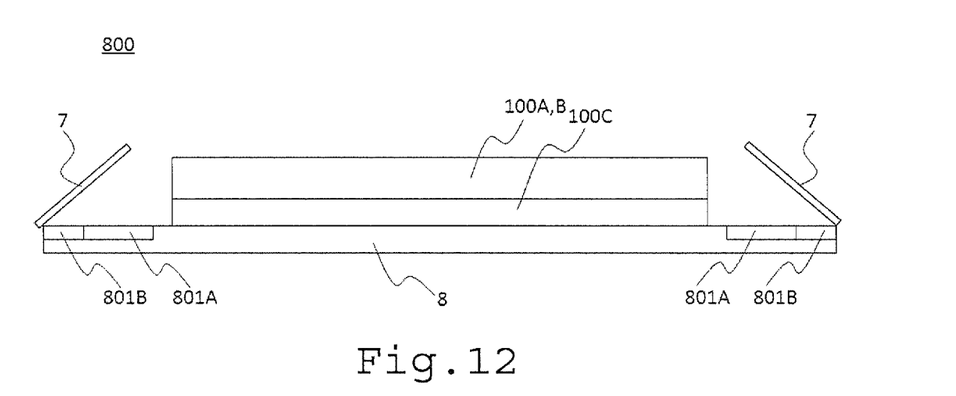
FIG. 12 is a cross-sectional conceptual diagram of a stacked type solar cell of an embodiment.

FIG. 12 shows a cross-sectional conceptual diagram of a solar cell 800 of the eighth embodiment. The solar cell 800 is similar to that of the seventh embodiment, except that three light concentrators 100A, 100B, and 100C are stacked, and the solar cell 800 has a photoelectric conversion element 801A having a wide gap light absorbing layer corresponding to the light concentrators 100A and 100B and a photoelectric conversion element 801B having a narrow gap light absorbing layer corresponding to the light concentrator 100C. The light concentrators 100A and 100B can concentrate light in a short wavelength band, and the light concentrator 100C can concentrate light in a long wavelength band. The light concentrated by each of the light concentrators is converted to electric energy by a suitable photoelectric conversion element 801. The form in which the light concentrators are stacked also has an advantage similar to that of the above embodiment.

Hereinafter, the light concentrators and the solar cells of the above embodiments will be described more specifically by the following examples.

Example 1

This embodiment is an example in which the light concentrating panel shown in FIG. 7 is embodied. Namely, in this embodiment, the panel size is 125 mm square×thickness of 1.4 mm. There is provided a pillar structure of a triangular lattice in which the refractive index of a first high refractive index layer is 1.8(@1000 nm)-1.9(@400 nm), the pitch of the diffraction grating is 460 nm, and the height is 300 nm. The refractive index of the first low refractive index layer which becomes a slot waveguide provided immediately beneath the diffraction grating is 1.1(@1000 nm)-1.2(@400 nm), the thickness is 30 nm, the refractive index of a second high refractive index layer under the first low refractive index layer is 1.8(@1000 nm)-1.9(@400 nm), the thickness is 0.7 mm, and an air space (second low refractive index layer) is provided under the second high refractive index layer.

Figure 13:
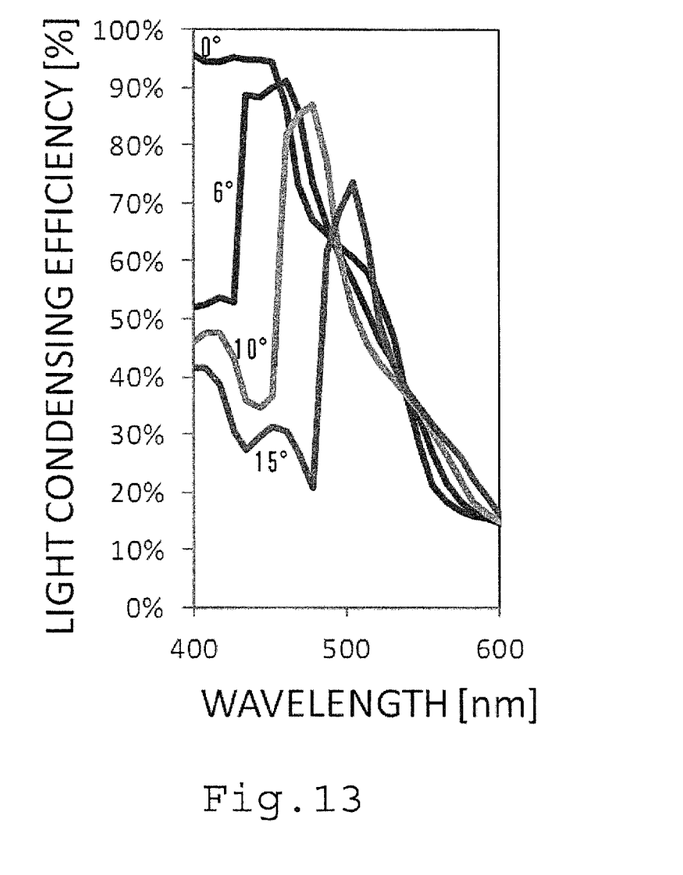
FIG. 13 is a graph showing incident angle dependency of a wavelength and a light concentrating rate of a light concentrator of an example 1.

FIG. 13 shows incident angle dependency of the light concentrating rate and the wavelength. As seen in FIG. 13, it is found that there is a wavelength band in which light can be concentrated by being converted to in-plane light with an efficiency of nearly 100%, and it is found that oblique incident light can be concentrated. Since the wavelength band in which light can be concentrated approximately corresponds to a wavelength band diffracted by a diffraction grating, a light concentrating wavelength range can be controlled by changing a pitch of the diffraction grating. Light in the wavelength band in which light is not concentrated transmits through a panel light concentrator.

Example 2

This embodiment is an example in which a light concentrating type solar cell of FIG. 11 is embodied using a light concentrating panel. A wafer-shaped crystal Si solar cell is cut and used as the solar cell and arranged at an end of a panel light concentrator. The panel light concentrator has a size of 125 mm square×height of 10 mm, has a mirror arranged at the end, and is configured that propagating light is reflected by the solar cell provided immediately beneath the mirror. This configuration allows the solar cell and the panel light concentrator to be separately manufactured, and moreover, since positional alignment is easy, the light concentrating type solar cell can be easily manufactured.

Since a spectral sensitivity region of the crystal Si solar cell is 400 nm to 1100 nm, three pairs of panel light concentrators having different diffraction grating pitches are stacked, and light is concentrated. Regarding the diffraction grating size of each panel light concentrator, the first pair has a pitch of 460 nm and a height of 300 nm, the second pair has a pitch of 640 nm and a height of 410 nm, the third pair has a pitch of 880 nm and a height of 570 nm, and any of the pairs have a pillar structure of a triangular lattice. The conditions other than the diffraction grating are similar to those of the example 1.

Figure 14:
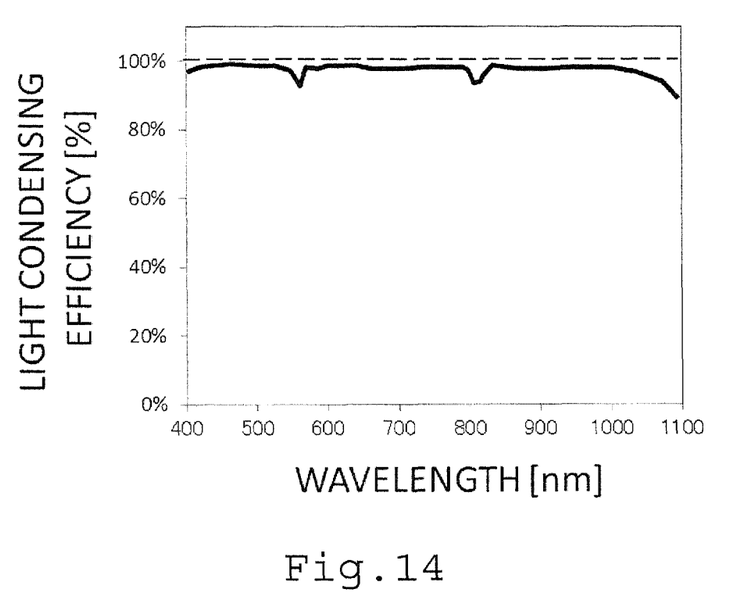
FIG. 14 is a graph showing a relationship between a wavelength and a light concentrating rate of a light concentrator of an example 2.

FIG. 14 shows wavelength dependency of incident light→the light concentrating rate of a panel light concentrator. As seen in FIG. 14, it is found that light can be concentrated in the spectral sensitivity region of 400 nm to 1100 nm of the crystal Si solar cell.

When this embodiment was irradiated with imitated sunlight 1 sun, a conversion efficiency of 22% was obtained. For comparison, a crystal Si solar cell using a wafer of 125 mm square was irradiated with the imitated sunlight 1 sun, and when the conversion efficiency was measured, it was 20%.

As shown in this disclosure, by virtue of the combination of the solar cell and the panel light concentrator, a low cost and high efficiency concentrating type solar cell in which the area of the solar cell can be reduced in comparison with the prior art, and the conversion efficiency is enhanced is obtained.

Example 3

This embodiment is an example in which a light concentrating type solar cell of FIG. 12 is embodied using a light concentrating panel. Two kinds of CIGS solar cells having different band gaps were used as the solar cell. A band end wavelength of each CIGS solar cell has a wide gap of 730 nm and a narrow gap of 1100 nm. As a panel light concentrator (having a size of 125 mm square) and a mirror at the end of the panel light concentrator, those similar to those of the Example 2 were used. The wide gap CIGS solar cells were arranged at the first and second pairs of the panel light concentrators, and the narrow gap CIGS solar cell was arranged at the third pair.

When this embodiment was irradiated with imitated sunlight 1 sun, a conversion efficiency of 32% was obtained. For comparison, a wide gap CIGS solar cell using a wafer of 125 mm square and a narrow gap CIGS solar cell were irradiated with the imitated sunlight 1 sun, and when the respective converting efficiencies were measured, they were 20% and 25%.

As shown in this embodiment, by virtue of the combination of the solar cell and the panel light concentrator, a low cost and high efficiency light concentrating type solar cell in which the area of the solar cell can be reduced in comparison with the prior art, and the conversion efficiency is enhanced is obtained. As described above, according to the embodiments, by virtue of the use of the light concentrator configured that the slot waveguide is combined with the diffraction grating, a light concentrate phenomenon which is not previously known can be exhibited. When a light concentrating type solar cell is constituted using the panel light concentrator, a high efficiency, low cost, and lightweight light concentrating type solar cell suitable for practical use can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A light concentrator for a solar cell comprising a first high refractive index layer, a first low refractive index layer, and a second high refractive index layer stacked in sequence,
wherein the first high refractive index layer has a periodic concavoconvex region and a plated-shape region, a first surface on the first low refractive index layer side of the first high refractive index layer has the periodic concavoconvex region, a second surface on the first low refractive index layer side which is opposite to the first surface on the first low refractive index layer side of the first high refractive index layer having the periodic concavoconvex region is a surface where a light enters, the thickness of the first low refractive index layer is 10 nm or more and 200 nm or less, the periodic concavoconvex region is between the plated-shaped region and the first low refractive index layer, a refractive index of the first low refractive index layer is not more than 1.3 a refractive index of the second high refractive index layer is not less than 1.8, and wherein the first low refractive index layer is a slot waveguide.

2. A stacked type light concentrator comprising:

plurality of the concentrator of claim 1 is stacked; and a second low refractive index layer which is between the second high refractive index layer of the one concentrator and the first low refractive index layer of the other concentrator.

3. The stacked type concentrator according to claim 2, wherein pitches of the periodic concavoconvex regions of the plurality of the concentrator are different from each other.

4. A solar cell comprising: the concentrator of claim 1; and a photoelectric conversion element on an optical path of the concentrator of claim 1.

5. A solar cell comprising:

the concentrator of claim 2; and a photoelectric conversion element on each of an optical path of the plurality of the concentrator of claim 2.

6. The solar cell according to claim 5, wherein pitches of the periodic concavoconvex regions of the concentrator are different from each other.

7. The solar cell according to claim 5 further comprising a photoelectric conversion element provided on an optical path of light concentrated by the other concentrator, wherein a size relation between the pitches of the periodic concavoconvex regions of the plurality of the concentrator and a size relation between absorption edge wavelengths of the photoelectric conversion elements correspond to each other.

8. The light concentrator according to claim 1, wherein a shape of the concavoconvex is a two-dimensional pattern or, a one-dimensional pattern.

9. The light concentrator according to claim 8, wherein the two-dimensional pattern includes a triangular lattice, a square grafting, or a cubic lattice.

10. The solar cell according to claim 4, wherein the photoelectric conversion element is a silicon-based photoelectric conversion element, a compound based photoelectric conversion element, an organic-based photoelectric conversion element, a quantum dot-based photoelectric conversion element, or a multi-junction type photoelectric conversion element.

11. The solar cell according to claim 5, wherein the photoelectric conversion element is a silicon-based photoelectric conversion element, a compound based photoelectric conversion element, an organic-based photoelectric conversion element, a quantum dot-based photoelectric conversion element, or a multi-junction type photoelectric conversion element.

12. The solar cell according to claim 5, wherein a number of the plurality of the concentrator of claim 2 is two, when the pitches of the periodic concavoconvex regions of the plurality of the concentrator are respectively $\Gamma_A$ and $\Gamma_B$ in a stacking sequence, absorption edge wavelengths of the plurality of the concentrator are respectively $\lambda_A$ and $\lambda_B$ in a stacking sequence, and $\Gamma_A$ and $\Gamma_B$ satisfy $\Gamma_A < \Gamma_B$, $\lambda_A \leq \lambda_B$ is established.

13. The solar cell according to claim 5, wherein a number of the plurality of the concentrator of claim 2 is three, when the pitches of the periodic concavoconvex regions of the plurality of the concentrator are respectively $\Gamma_A$, $\Gamma_B$' and $\Gamma_C$ in a stacking sequence, edge wavelengths of the plurality of the concentrator are respectively $\lambda_A$, $\lambda_B$ and $\lambda_C$ in a stacking sequence, and $\Gamma_A$, $\Gamma_B$ and $\Gamma_C$ satisfy $\Gamma_A < \Gamma_B < \Gamma_C$, $\lambda_A \leq \lambda_B \leq \lambda_C$ is established.

14. The light concentrator according to claim 1, wherein the plate-shaped region is physically contact with the periodic concavoconvex region.

15. The light concentrator according to claim 1, wherein the first high refractive index layer is a single layer comprising a single material.

16. The light concentrator according to claim 1, wherein the refractive index of the first low refractive index layer is lower than refractive index of the first high refractive index layer.

17. The light concentrator according to claim 1, wherein the refractive index of the first low refractive index layer is equal to 1.2 or less, and the refractive index of the second high refractive index layer is equal to 1.9 or more.

18. The light concentrator according to claim 1, wherein the refractive index of the first low refractive index layer is not more than 1.2 and not less than 1.1, and the refractive index of the second high refractive index layer is not more than 1.9 and not less than 1.8.

19. The light concentrator according to claim 1, wherein the refractive index of the first high refractive index layer is not less than 1.5.

20. The light concentrator according to claim 1, wherein the refractive index of the first high refractive index layer is not less than 1.5 times of the refractive index of the first low refractive index layer.

* * * * *